(12) United States Patent
Kaneko et al.

(10) Patent No.: US 7,301,179 B2
(45) Date of Patent: Nov. 27, 2007

(54) SEMICONDUCTOR DEVICE HAVING A HIGH BREAKDOWN VOLTAGE TRANSISTOR FORMED THEREON

(75) Inventors: Saichirou Kaneko, Muko (JP); Kazuyuki Sawada, Hirakata (JP); Toshihiko Uno, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 69 days.

(21) Appl. No.: 11/204,052

(22) Filed: Aug. 16, 2005

(65) Prior Publication Data

US 2006/0055064 A1 Mar. 16, 2006

(30) Foreign Application Priority Data

Sep. 16, 2004 (JP) ............... 2004-270207

(51) Int. Cl.
*H01L 29/66* (2006.01)
(52) U.S. Cl. .............. 257/170; 257/168; 257/409; 257/487; 257/491; 257/787
(58) Field of Classification Search ............... 257/100, 257/433, 434, 687, 787
See application file for complete search history.

(56) References Cited

U.S. PATENT DOCUMENTS 6,333,206 B1 * 12/2001 Ito et al. .............. 438/106
2002/0056844 A1 * 5/2002 Yamazaki et al. ............ 257/81
2002/0135019 A1 * 9/2002 Noda .............. 257/367
2005/0062081 A1 * 3/2005 Takami ............... 257/288

FOREIGN PATENT DOCUMENTS

JP 09-0252131 * 9/1997

OTHER PUBLICATIONS

Fujishima et al.; A 700V Lateral Power MOSFET with Narrow Gap Double Metal Field Plates Realizing Low On-resistance and Long-term Stability of Performance; *International Symposium on Power Semiconductor Devices & ICs*; c. 2001.; pp. 255.
Hossain et al.; "Field-plate Effects on the Breakdown Voltage of an Integrated High-voltage LDMOS Transistor"; *International Symposium on Power Semiconductor Devices & ICs*; c. 2004; pp. 237.

* cited by examiner

*Primary Examiner*—Jerome Jackson
*Assistant Examiner*—Jami M Valentine
(74) *Attorney, Agent, or Firm*—McDermott Will & Emery LLP

(57) ABSTRACT

An ion-through region 100, 102 is provided as a first opening in a passivation film 90 on a source electrode 70 and a drain electrode 80. The passivation film 90 is coated with a sealing resin to package the semiconductor device. At this point, the ion-through region 100, 102 is filled with the sealing resin to put the sealing resin into direct contact with the source electrode 70 and the drain electrode 80. With this structure, movable ions accumulated at an interface of the sealing resin with the passivation film 90 in a high temperature and high humidity atmosphere are discharged to the source electrode 70 and the drain electrode 80 via the ion-through region 100, 102 and thus do not influence an N⁻-type extended drain region 30. Therefore, the drain breakdown voltage can be improved.

6 Claims, 14 Drawing Sheets

SEMICONDUCTOR DEVICE HAVING A HIGH BREAKDOWN VOLTAGE TRANSISTOR FORMED THEREON

BACKGROUND OF THE INVENTION

1. Field of the Invention

The present invention relates to a semiconductor device, and more specifically to a semiconductor device in which a semiconductor substrate having a high breakdown voltage transistor formed thereon is covered with a sealing resin.

2. Description of the Background Art

Recently, as a power source IC used in a power source circuit, a power source IC of a switching system is used because it is compact, lightweight and highly efficient. As an element for controlling the power of such a power source IC, a power MOSFET (field effect transistor) is generally used because of the reasons of power consumption and miniaturization. A power MOSFET, which is produced based on a CMOS process, is also low-cost.

In order to drive a power MOSFET at high speed, the device including the power MOSFET needs to have a high breakdown voltage. For example, a power source IC of a switching system driven at AC100 to 200 V needs to have a breakdown voltage of 700 V or higher in order to drive a transistor. A semiconductor device including a power MOSFET having such a breakdown voltage characteristic is usually packaged with a resin when provided as a product. However, in a semiconductor device packaged with a resin, the drain breakdown voltage tends to be lowered as time passes when exposed to a high temperature and high humidity atmosphere. For suppressing the reduction in the drain breakdown voltage, various proposals have been made.

One reason that the drain breakdown voltage is reduced is that movable ions are accumulated at an interface between the passivation film of the semiconductor device and the sealing resin used for packaging the semiconductor device in a high temperature and high humidity atmosphere, and thus distort the equipotential distribution of the drain voltage and cause a local concentration of electric field. N. Fujishima, M. Saito, A. Kitamura, Y. Urano, G. Tada and Y. Tsuruta, "A 700 V Lateral Power MOSFET with Narrow Gap Double Metal Field Plates Realizing Low On-resistance and Long-term Stability of Performance", Proceeding of International Symposium on Power Semiconductor Device & ICs, 2001, pp. 255-258, proposes a semiconductor device capable of shielding the influence of accumulated ions and thus alleviating the local concentration of electric field by narrowing the gap between the source electrode and the drain electrode. However, in this semiconductor device, a narrowed gap between the source electrode and the drain electrode strengthens the electric field on the surface of the substrate and thus lowers the breakdown voltage of the device. In order to suppress the reduction in the breakdown voltage of the device, the inter-layer film is made thicker than usual. For example, in order to narrow the gap between the source electrode and the drain electrode to 15 μm, the inter-layer film, which is usually about 1.5 μm thick, is made as thick as about 4.5 μm. However, a mere increase in the thickness of the inter-layer film is not sufficient to form a contact hole easily, and also enlarges the steps on the surface of the inter-layer film. In order to solve these problems, a two-layer structure is adopted for the source electrode and the drain electrode.

FIG. 13 is a cross-sectional view showing a structure of a lateral high breakdown voltage field effect transistor (MOSFET) including electrodes of a two-layer structure. In FIG. 13, the lateral high breakdown voltage MOSFET includes a $P^-$-type substrate 310, an $N^+$-type source region 320, an $N^-$-type extended drain region 330, a gate insulating film 331, an $N^+$-type drain region 340, a gate electrode 350, a first inter-layer film 360, a second inter-layer film 361, a first source electrode 370, a second source electrode 371, a first drain electrode 380, a second drain electrode 381, a passivation film 390, and a sealing resin 333.

The $P^-$-type substrate 310 is a base substrate acting as a base for forming the MOSFET. In a main surface portion of the $P^-$-type substrate 310, the $N^+$-type source region 320, the $N^-$-type extended drain region 330, and the $N^+$-type drain region 340 are formed. The $N^-$-type extended drain region 330 and $N^+$-type drain region 340 are in contact with each other. The gate insulating film 331 is formed on a surface of the $N^-$-type extended drain region 330, and an end of the gate insulating film 331 is extended to overlap the $N^+$-type source region 320. The gate electrode 350 is formed on the gate insulating film 331. The first inter-layer film 360 is an insulating film formed on the gate insulating film 331 so as to cover the gate electrode 350.

A source electrode has a two-layer structure including the first source electrode 370 and the second source electrode 371. The first source electrode 370 is formed on the first inter-layer film 360 so as to be connected to the $N^+$-type source region 320. The second source electrode 371 is formed so as to be connected to the first source electrode 370. Similarly, a drain electrode has a two-layer structure including the first drain electrode 380 and the second drain electrode 381. The first drain electrode 380 is formed on the first inter-layer film 360 so as to be connected to the $N^+$-type drain region 340. The second drain electrode 381 is formed so as to be connected to the first drain electrode 380. The second inter-layer film 361 is formed between the first source electrode 370 and the second source electrode 371 and between the first drain electrode 380 and the second drain electrode 381. In this specification, the various elements formed on the $P^-$-type substrate or an equivalent thereto will be collectively referred to a "semiconductor substrate body". A surface of the substrate body including the electrodes of the two-layer structure is covered with the passivation film 390 formed of an SiN film. The passivation film 390 is covered with the sealing resin 333. The $P^-$-type substrate 310 is electrically connected to the source in an area which is not shown in FIG. 13.

In the lateral high breakdown voltage MOSFET having the above-described structure, when a high voltage is applied to the second drain electrode 381 in an off state, a reverse voltage is applied to a junction between the $N^-$-type extended drain region 330 and the $P^-$-type substrate 310, and a depletion layer expands two-dimensionally in the longitudinal direction and the lateral direction in the $N^-$-type extended drain region 330. As a result, the $N^-$-type extended drain region 330 is completely depleted, and equipotential lines of the drain voltage are uniformly distributed in the $N^-$-type extended drain region 330.

In a high temperature and high humidity atmosphere, movable ions indicated as anions 344 and cations 355 in FIG. 13 are accumulated at an interface of the sealing resin 333 with the passivation film 390. When the movable ions influence the $N^-$-type extended drain region 330, the above-mentioned distribution of the equipotential lines of the drain voltage tend to be distorted to cause a local concentration of electric field, resulting in reduction in the drain breakdown voltage. In the above-described lateral high breakdown MOSFET including the electrodes of the two-layer structure, the $N^-$-type extended drain region 330 is unlikely to be influenced by the movable ions accumulated at the interface between the passivation film 390 and the sealing resin 333 owing to the above-mentioned narrowed gap between the source electrode and the drain electrode. Therefore, the reduction in the drain breakdown voltage can be suppressed.

However, the production of the above-described lateral MOSFET including the electrodes of the two-layer structure requires a plurality of additional steps in addition to the general steps for producing a lateral MOSFET as follows: (i) the step of forming the second inter-layer film 361, (ii) the step of forming a contact hole by etching the second inter-layer film 361; (iii) the step of forming the second source electrode 371 and the second drain electrode 381, and (iv) the step of processing the second source electrode 371 and the second drain electrode 381. For the processing in steps (ii) and (iv), at least two additional photomasks are required. As can be seen from this, the lateral MOSFET including the electrodes of the two-layer structure has the problems of the complex production process and being highly costly. In addition, the two-layer structure of the electrodes is against the miniaturization of devices, which is being promoted in the field of power MOSFETs as in the other fields.

SUMMARY OF THE INVENTION

Therefore, an object of the present invention is to provide a semiconductor device which can be produced by a simple method and at low cost, can prevent reduction in the drain breakdown voltage in a high temperature and high humidity atmosphere, and can be suitable for miniaturization.

A first aspect of the present invention is directed to a semiconductor device in which a semiconductor substrate having a high breakdown voltage transistor formed thereon is covered with a sealing resin. The semiconductor device comprises a source region and a drain region formed in a main surface portion of the semiconductor substrate; a gate insulating film formed on the drain region and having an end extended to overlap the source region; a gate electrode formed on the gate insulating film; a source electrode connected to the source region; a drain electrode connected to the drain region; an inter-layer film for covering the gate electrode and electrically insulating the gate electrode, the source electrode and the drain electrode from one another; a passivation film for covering an entire surface of a semiconductor substrate body; a first opening formed in the passivation film; and a sealing resin formed on the passivation film.

A feature of the semiconductor device according to the present invention resides in that the first opening is formed on at least either one of the source electrode and the drain electrode; and that the sealing resin fills the first opening and is in direct contact with at least either one of the source electrode and the drain electrode. Owing to such a structure, even if movable ions are accumulated at an interface of the sealing resin with the passivation film in a high temperature and high humidity atmosphere, the movable ions move to at least either one of the source electrode and the drain electrode via the sealing resin filing the first opening and are finally discharged outside. Accordingly, the drain electric field is not influenced by the movable ions, and therefore the reduction in the drain breakdown voltage can be prevented. Since it is not necessary to adopt a two-layer structure for the electrodes, the semiconductor device can be produced with a simple process at low cost, and is suitable for miniaturization.

A second aspect of the present invention is directed to a semiconductor device in which a semiconductor substrate having a high breakdown voltage transistor formed thereon is covered with a sealing resin. The semiconductor device comprises a source region and a drain region formed in a main surface portion of the semiconductor substrate; agate insulating film formed on the drain region and having an end extended to overlap the source region; a gate electrode formed on the gate insulating film; a source electrode connected to the source region; a drain electrode connected to the drain region; an inter-layer film for covering the gate electrode and electrically insulating the gate electrode, the source electrode and the drain electrode from one another; a passivation film for covering an entire surface of a semiconductor substrate body; a first opening formed in the passivation film; a sealing resin formed on the passivation film; and an assisting electrode provided below the passivation film and electrically connected to the source electrode or the drain electrode.

A feature of the semiconductor device according to the present invention resides in that the assisting electrode is formed of a conductive material which is different from a material forming the source electrode or the drain electrode connected to the assisting electrode; the first opening is formed on the assisting electrode; and the sealing resin fills the first opening and is in direct contact with the assisting electrode. With such a structure, even if movable ions are accumulated at an interface of the sealing resin with the passivation film in a high temperature and high humidity atmosphere, the movable ions move to at least either one of the source electrode and the drain electrode via the sealing resin filing the first opening and are finally discharged outside. Accordingly, the drain electric field is not influenced by the movable ions, and therefore the reduction in the drain breakdown voltage can be prevented. Since it is not necessary to adopt a two-layer structure for the electrodes, the semiconductor device can be produced with a simple process at low cost, and is suitable for miniaturization. In addition, the first opening can be formed on the assisting electrode as well as on the source electrode and the drain electrode. Therefore, the present invention is applicable to a semiconductor device having a more complex and more miniaturized pattern.

In each of the semiconductor devices described above, the passivation film has a second opening formed therethrough for connecting a metal wire extended from the outside of the semiconductor device to at least one type of electrode selected from the source electrode, the drain electrode and the assisting electrode. The first opening and the second opening are preferably discrete from each other. By providing the second opening, the above-mentioned various types of electrodes provided below the passivation film are exposed to provide an area, generally referred to as a pad area, for connecting a metal wire extended from the outside of the semiconductor device. According to the present invention, the first opening and the second opening are located discretely from each other. Therefore, the first opening can be formed at an appropriate position where the movable ions are accumulated. This can further suppress the reduction in the drain breakdown voltage.

The inter-layer film has a contact hole formed therethrough on a part of the source region or the drain region; and the source electrode or the drain electrode fill the contact hole so as to be respectively connected to the source region or the drain region which is below the contact hole. According to the present invention, the first opening and the contact hole are preferably located at positions which do not overlap each other in a direction vertical to the semiconductor substrate. Owing to such a structure, the first opening is formed in a flat area instead of on the contact hole having a large step. Therefore, the semiconductor device can have a higher breakdown voltage.

The drain region preferably includes a high concentration drain region having a relatively high impurity concentration and an extended drain region having an impurity concentration lower than the impurity concentration of the high concentration drain region. The drain electrode is preferably connected to the high concentration drain region. With such a structure, the semiconductor device can have a higher breakdown voltage, and is usable in a condition where, for example, a high voltage of 600 V or higher is applied to the drain electrode.

A third aspect of the present invention is directed to a semiconductor device in which a semiconductor substrate having a high breakdown voltage transistor formed thereon is covered with a sealing resin. The semiconductor device comprises a source region and a drain region provided in a main surface portion of the semiconductor substrate; a gate insulating film formed on the drain region and having an end extended to overlap the source region; a gate electrode formed on the gate insulating film; a source electrode connected to the source region; a drain electrode connected to the drain region; an inter-layer film for covering the gate electrode and electrically insulating the gate electrode, the source electrode and the drain electrode from one another; a passivation film for covering an entire surface of a semiconductor substrate body; and a sealing resin formed on the passivation film.

A feature of the semiconductor device according to the present invention resides in further comprising a floating electrode formed on the inter-layer film between the source electrode and the drain electrode, or between the source electrodes adjacent to each other. Owing to such a structure, the movable ions accumulated in the sealing resin in a high temperature and high humidity atmosphere are shielded by the floating electrode. Therefore, the drain electric field is unlikely to be influenced by the movable ions. As a result, the reduction in the drain breakdown voltage in the high temperature and high humidity atmosphere can be suppressed. In addition, such a structure does not need to form the openings in the passivation film. Therefore, the semiconductor device can be produced with a simpler process and at lower cost.

In such a semiconductor device also, the drain region preferably includes a high concentration drain region having a relatively high impurity concentration and an extended drain region having an impurity concentration lower than the impurity concentration of the high concentration drain region. The drain electrode is preferably connected to the high concentration drain region. Owing to such a structure, the semiconductor device can have a higher breakdown voltage, and is usable in a condition where, for example, a high voltage of 600 V or higher is applied to the drain electrode.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
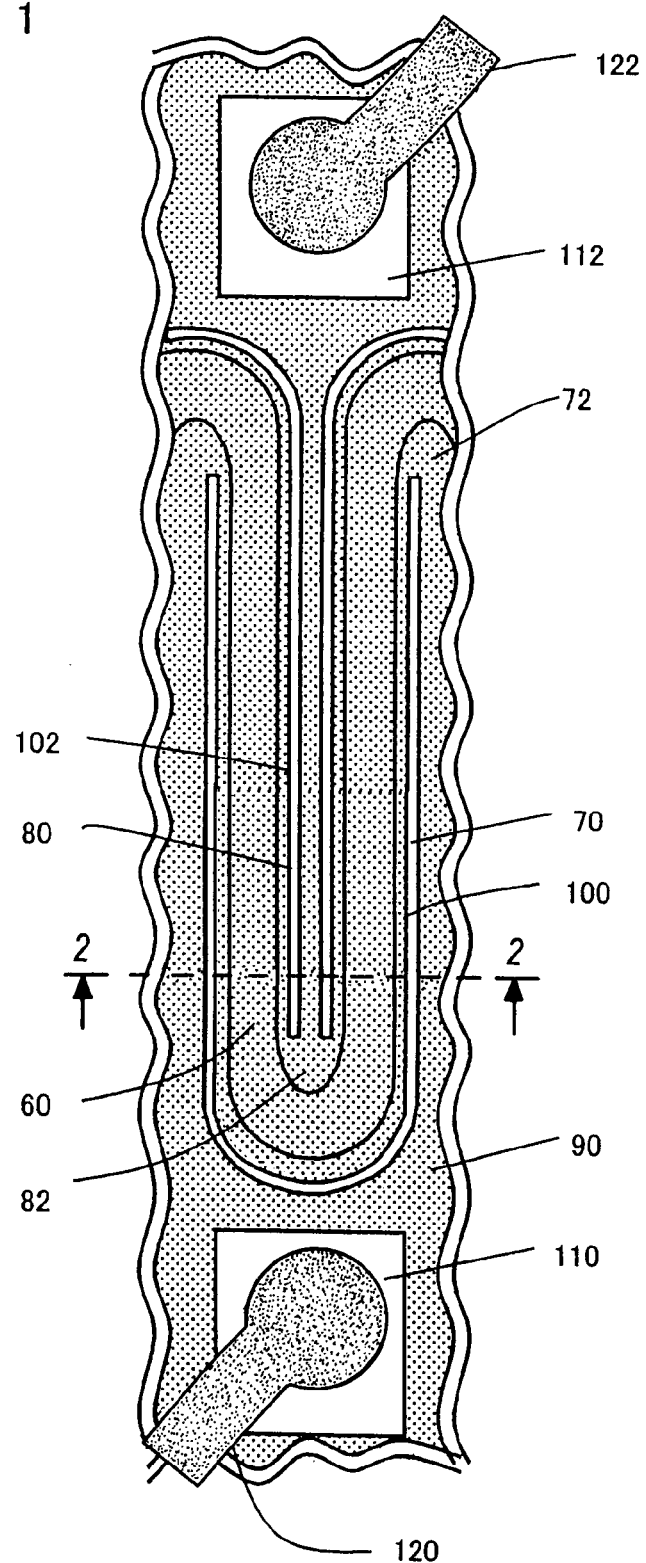
FIG. 1 is a plan view of one main part of a semiconductor device according to a first embodiment of the present invention.

Hereinafter, a semiconductor device according to a first embodiment of the present invention will be described. FIG. 1 is a plan view of one main part of the semiconductor device according to the first embodiment. In FIG. 1, the semiconductor device includes an inter-layer film 60, a source electrode 70, a drain electrode 80, a passivation film 90, ion-through regions 100 and 102, a source pad region 110, a drain pad region 112, and bonding wires 120 and 122.

The ion-through regions 100 and 102, which is one feature of the first embodiment, are each a first opening formed in the passivation film 90. By forming the ion-through regions 100 and 102 as the first openings in the passivation film 90, the source electrode 70 and the drain electrode 80 provided below the passivation film 90 are partially exposed. The source pad region 110 and the drain pad region 112 are each a second opening formed in the passivation film 90. By forming the source pad region 110 and the drain pad region 112 as the second openings in the passivation film 90, the source electrode 70 and the drain electrode 80 provided below the passivation film 90 are partially exposed so as to be connectable to the bonding wires 120 and 122. The bonding wires 120 and 122 are metal wires extended from the outside of the semiconductor device. In this embodiment, the bonding wire 120 is connected to the source electrode 70, and the bonding wire 122 is connected to the drain electrode 80. The ion-through regions 100 and 102 as the first openings are discretely located from the source pad region 110 and the drain pad region 112 as the second openings.

Figure 2:
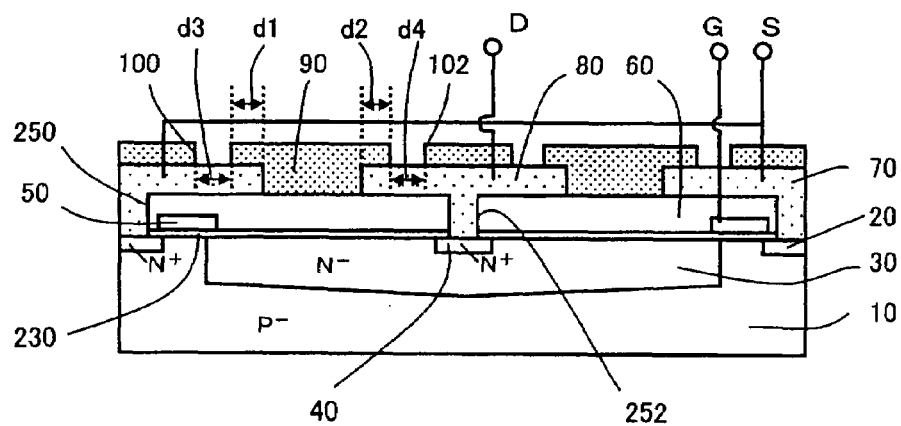
FIG. 2 is a cross-sectional view showing a structure of the semiconductor device according to the first embodiment.

FIG. 2 is a cross-sectional view showing a structure of the semiconductor device taken along line A-A' in FIG. 1. In FIG. 2, the semiconductor device includes a lateral high breakdown voltage MOSFET in which the source electrode 70 and the drain electrode 80 are provided in the same plane. The semiconductor device includes a P⁻-type substrate 10, an N⁺-type source region 20, an N⁻-type extended drain region 30, an N⁺-type drain region 40, a gate electrode 50, the inter-layer film 60, the source electrode 70, the drain electrode 80, the passivation film 90, the ion-through regions 100 and 102, a gate insulating film 230, and contact holes 250 and 252.

The P⁻-type substrate 10 is a base substrate acting as a base for forming the MOSFET. In a main surface portion of the P⁻-type substrate 10, the N⁺-type source region 20, the N⁻-type extended drain region 30, and the N⁺-type drain region 40 are formed. A drain region includes the N⁺-type drain region 40 and the N⁻-type extended drain region 30 having a low impurity concentration than that of the N⁺-type drain region 40. The drain electrode 80 is connected to the N⁺-type drain region 40 having a higher impurity concentration. This realizes a high breakdown voltage semiconductor device which is usable in a condition where, for example, a high voltage of 600 V or higher is applied to the drain electrode 80. The P⁻-type substrate 10 is electrically connected to the source in an area which is not shown in FIG. 2. Therefore, the P⁻-type substrate 10 and the source have an equal potential.

The gate insulating film 230 is formed on a surface of the N⁻-type extended drain region 30, and an end of the gate insulating film 230 is extended to overlap the N⁺-type source region 20. The gate electrode 50 is formed on the gate insulating film 230. The inter-layer film 60 is an insulating film formed on the gate insulating film 230 so as to cover the gate electrode 50. The contact holes 250 and 252 are formed through the inter-layer film 60. The source electrode 70 is connected to the N⁺-type source region 20 via the contact hole 250, and the drain electrode 80 is connected to the N⁺-type drain region 40 via the contact hole 252. In this specification, the elements formed on the P⁻-type substrate 10 or an equivalent thereto will be collectively referred to as a "semiconductor substrate body". The passivation film 90 covers a surface of the semiconductor substrate body. As described above, the ion-through regions 100 and 102 are formed on the source electrode 70 and the drain electrode 80.

Figure 3:
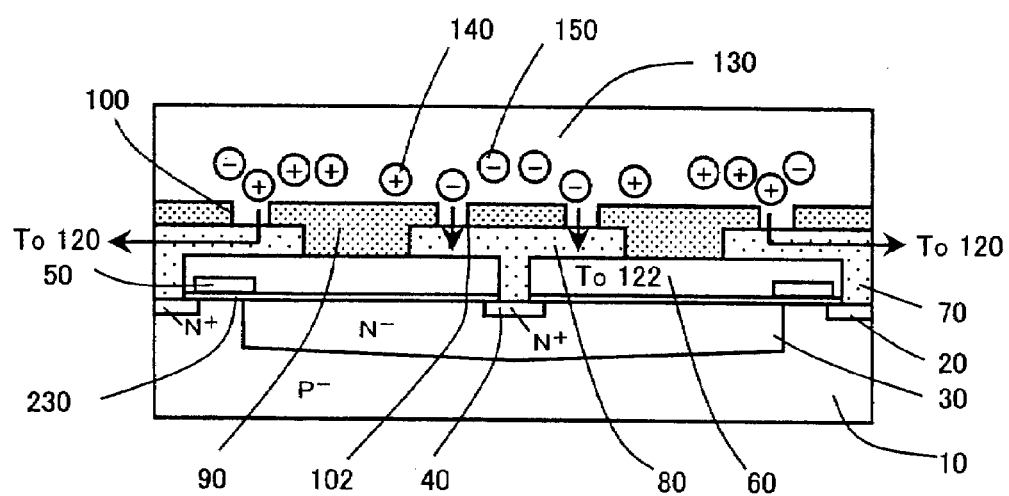
FIG. 3 is a cross-sectional view showing the semiconductor device according to the first embodiment in the state of being packaged with a sealing resin.

A semiconductor device used as an actual product is packaged with a sealing resin 130 as shown in FIG. 3. FIG. 3 is a cross-sectional view showing the semiconductor device shown in FIG. 2 in the state of being packaged with the sealing resin 130. In FIG. 3, the sealing resin 130 covers the entire surface of the semiconductor substrate body. As one feature of this embodiment, the sealing resin 130 fills the ion-through regions 100 and 102, and is in direct contact with the source electrode 70 and the drain electrode 80. This structure provides the semiconductor device with a high drain breakdown voltage. The reasons will be described in detail below.

In a lateral high breakdown voltage MOSFET having the above-described structure, when a high voltage is applied to the drain electrode 80 in an off state, a reverse voltage is applied to a junction between the N⁻-type extended drain region 30 and the P⁻-type substrate 10, and a depletion layer expands two-dimensionally in the longitudinal direction and the lateral direction in the N⁻-type extended drain region 30. As a result, the N⁻-type extended drain region 30 is completely depleted, and equipotential lines of the drain voltage are uniformly distributed in the N⁻-type extended drain region 30.

When the semiconductor device in such a state is exposed to a high temperature and high humidity atmosphere, movable ions indicated as anions 140 and cations 150 in FIG. 3 are accumulated at an interface of the sealing resin 130 with the passivation film 90. In the semiconductor device according to this embodiment, the ion-through regions 100 and 102 are formed in the passivation film 90 and are filled with the sealing resin 130. Therefore, the sealing resin 130 is indirect contact with the source electrode 70 and the drain electrode 80. Owing to such a structure, the movable ions (the anions 140 and the cations 150) accumulated at the interface of the sealing resin 130 with the passivation film 90 move, as indicated by the arrows in FIG. 3, to the source electrode 70 and the drain electrode 80 via the ion-through regions 100 and 102. Finally, the movable ions are discharged to the bonding wires 120 and 122 extended from the outside the semiconductor device. Accordingly, the N⁻-type extended drain region 30 is unlikely to be influenced by the movable ions. As a result, the reduction in the drain breakdown voltage can be suppressed.

The semiconductor device according to the present invention is generally used in the state where the potential of the source electrode 70 is zero and a high voltage is applied to the drain electrode 80. Under such conditions, it is considered that the anions 140 are discharged through the source-side ion-through region 100 and the cations 150 are discharged through the drain-side ion-through region 102. However, either type of ions may pass through either ion-through region.

The lateral high breakdown voltage MOSFET having the above-described structure is produced, for example, as follows. In a main surface portion of the P⁻-type substrate 10 (impurity concentration: about 1E14 to about 1E15/cm³), the N⁺-type drain region 40 (impurity concentration: about 1E18 to about 1E20/cm³) is formed. The N⁻-type extended drain region 30 (impurity concentration: about 1E15 to about 1E17/cm³) is formed so as to be connected to the N⁺-type drain region 40. Also in a main surface portion of the P⁻-type substrate 10, the N⁺-type source region 20 (impurity concentration: about 1E18 to about 1E20/cm³) is formed. Next, the gate insulating film 230 is formed on the N⁻-type extended drain region 30.

Next, the gate electrode 50 is formed on the gate insulating film 230. The inter-layer film 60 is formed so as to cover the gate electrode 50. In the inter-layer film 60, the contact holes 250 and 252 are formed in positional correspondence with the N⁺-type source region 20 and the N⁺-type drain region 40. Next, the source electrode 70 and the drain electrode 80 are formed so as to fill the contact holes 250 and 252. Then, the passivation film 90 is formed so as to cover the source electrode 70 and the drain electrode 80.

Next, in the passivation film 90, the source pad region 110 and the drain pad region 112 are formed. Portions of the passivation film 90 on the source electrode 70 and the drain electrode 80 are opened to form the ion-through regions 100 and 102. At this point, the ion-through regions 100 and 102 are formed at positions which do not overlap the contact holes 250 and 252, preferably at positions far from the contact holes 250 and 252, with respect to a direction vertical to the P⁻-type substrate 10. The reason is that at positions right above the contact holes 250 and 252 and in the vicinity thereof, various electrodes and films have a large thickness and thus form large steps.

Then, an upper surface of the passivation film 90 is coated with the sealing resin 130, and thus the semiconductor device is packaged. At this point, the ion-through regions 100 and 102 are also filled with the sealing resin 130, such that the sealing resin 130 is in direct contact with the source electrode 70 and the drain electrode 80.

In the semiconductor device produced as described above, for example, distance d1 (FIG. 2) between an end of the source electrode 70 and the ion-through region 100 is about 5 µm, distance d2 between an end of the drain electrode 80 and the ion-through region 102 is about 5 µm, width d3 of the ion-through region 100 is about 6 µm, and width d4 of the ion-through region 102 is about 6 µm.

As described above, the semiconductor device according to this embodiment can suppress the reduction in the drain breakdown voltage by a simple structure of providing openings in the passivation film 90. Accordingly, it is not necessary to adopt a two-layer structure for the electrodes as is required in the conventional semiconductor device, and thus the semiconductor device can be provided with a simple process and at low cost.

Figure 4:
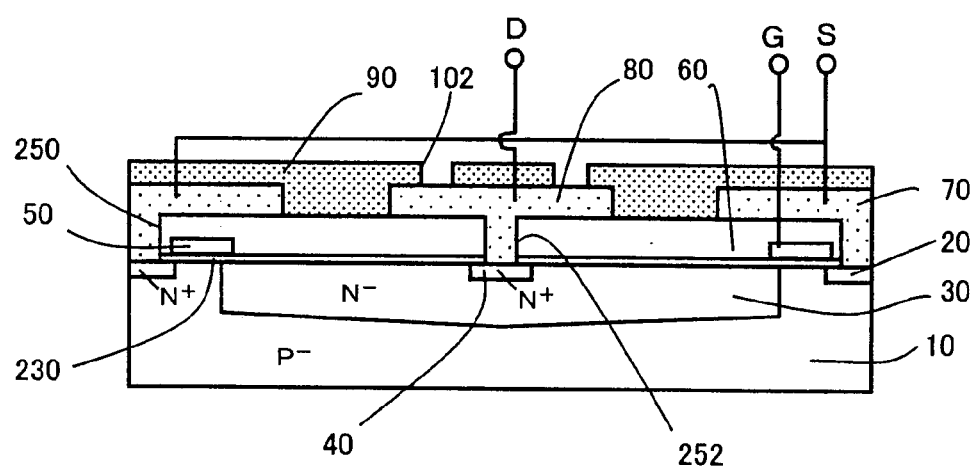
FIG. 4 is a cross-sectional view showing another structure of the semiconductor device according to the first embodiment.
Figure 5:
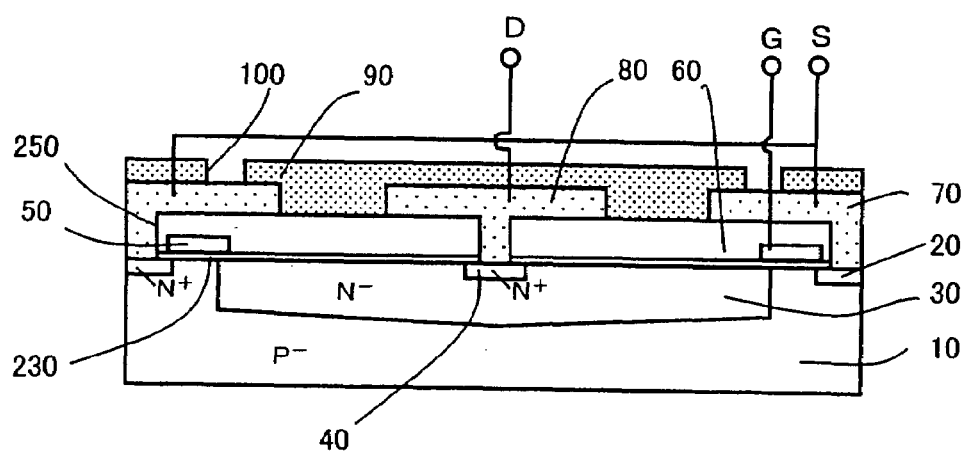
FIG. 5 is a cross-sectional view showing another structure of the semiconductor device according to the first embodiment.

In the above description, the ion-through regions 100 and 102 as the first openings are formed on the source electrode 70 and the drain electrode 80. The present invention is not limited to this, and a first opening may be formed on either the source electrode 70 or the drain electrode 80. FIG. 4 and FIG. 5 are each a cross-sectional view showing another structure of the semiconductor device according to the first embodiment. The basic structure shown in each of FIG. 4 and FIG. 5 is substantially the same as that shown in FIG. 2. In FIG. 4, only the ion-through region 102 is formed on the drain electrode 80. In FIG. 5, only the ion-through region 100 is formed on the source electrode 70. With such a structure also, the reduction in the drain breakdown voltage can be suppressed as with the structure shown in FIG. 2.

Figure 14:
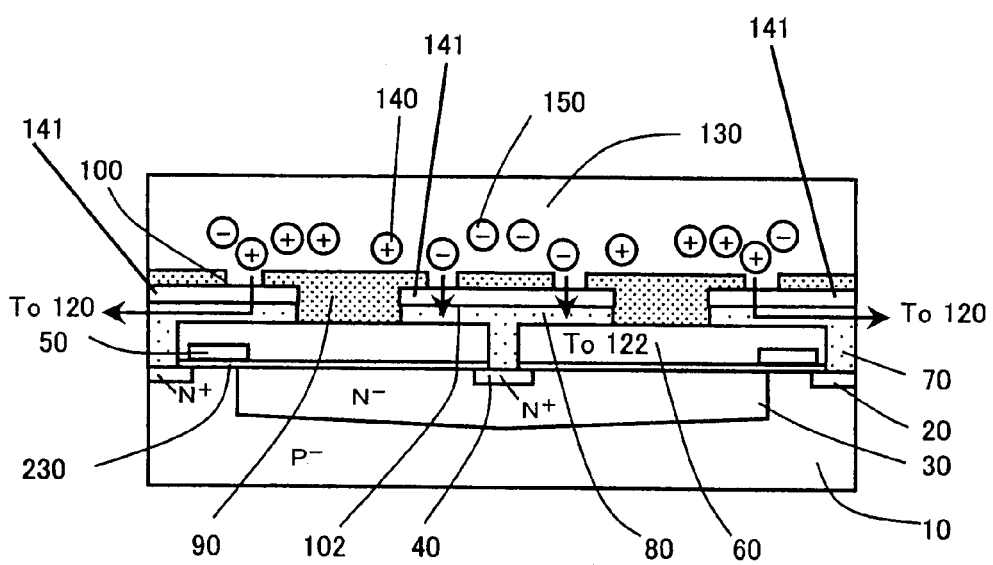
FIG. 14 is a cross-sectional view illustrating a semiconductor device in which the assisting electrodes 141 are added to the embodiment shown in FIG. 3.

In the above description, the source electrode 70 and the drain electrode 80 are exposed by the ion-through regions 100 and 102 as the first openings and put into direct contact with the sealing resin 130. The present invention is not limited to this, and assisting electrodes 141 electrically connected to the source electrode 70 and the drain electrode 80 may be exposed by the ion-through regions 100 and 102. FIG. 14 is a cross-sectional view illustrating a semiconductor device in which the assisting electrodes 141 are added to the structure shown in FIG. 3. The assisting electrodes 141 are formed of a material different from the material of the source electrode 70 and the drain electrode 80, and are formed below the passivation film 90. In the case where the source electrode 70 and the drain electrode 80 are formed of aluminum, assisting electrodes 141 formed of a polysilicon thin film or a copper thin film may be used.

Similarly, the source pad region 110 and the drain pad region 120 as the second openings may be formed to expose at least one type of electrode selected from the source electrode 70, the drain electrode 80, and the above-described assisting electrode(s) In this case, the exposed electrode may be connected to a metal wire extended from the outside of the semiconductor device.

The planar pattern of the semiconductor device shown in FIG. 1 is merely exemplary, and the present invention is not limited to such a pattern. For example, in FIG. 1, the ion-through regions 100 and 102 are U-shaped and located to face each other. The shape and location of the ion-through regions 100 and 102 are not limited to this. In FIG. 1, the ion-through regions 100 and 102 are not formed to reach an end 72 of the source electrode 70 and an end 82 of the drain electrode 80. Alternatively, the ion-through regions 100 and 102 may be extended up to the ends 72 and 82.

Figure 6:
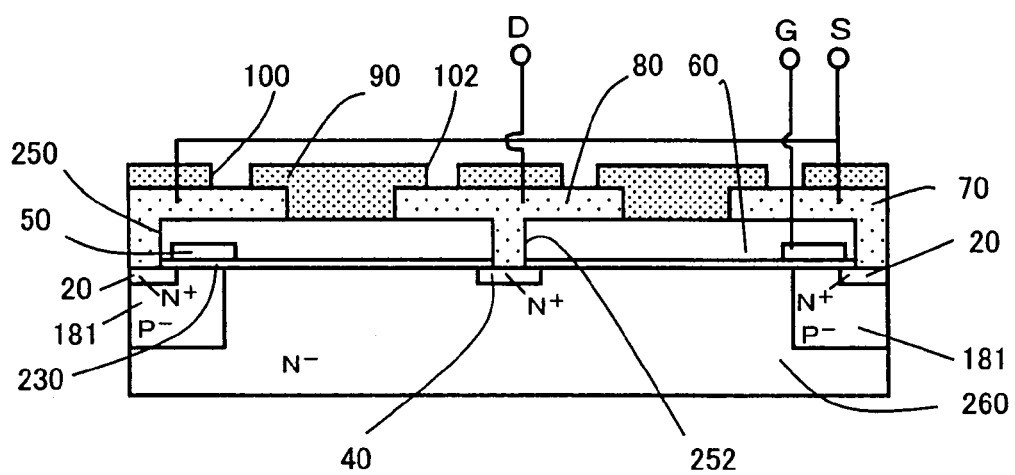
FIG. 6 is a cross-sectional view showing another structure of the semiconductor device according to the first embodiment.

The structure of the semiconductor substrate and the regions formed therein are not limited to the above-described structure. The present invention is applicable to various types of structures. FIG. 6 is a cross-sectional view of a semiconductor device which is different from the semiconductor device shown in FIG. 2 in the structure of the semiconductor substrate and the regions formed therein. In FIG. 6, in a main surface portion of an N$^-$-type semiconductor 260 (impurity concentration: about 1E14 to about 1E16/cm$^3$), the N$^+$-type drain region 40 (impurity concentration: about 1E18 to about 1E20/cm$^3$) and the N$^+$-type source region 20 (impurity concentration: about 1E18 to about 1E20/cm$^3$) are formed. Around the N$^+$-type source region 20, a P$^-$-type well region 181 is formed. As can be seen from the above, according to the present invention, the N$^-$-type drift region 260 shown in FIG. 6 is usable instead of the N$^-$-type reserve region shown in FIG. 2 through FIG. 5.

Second Embodiment

Figure 7:
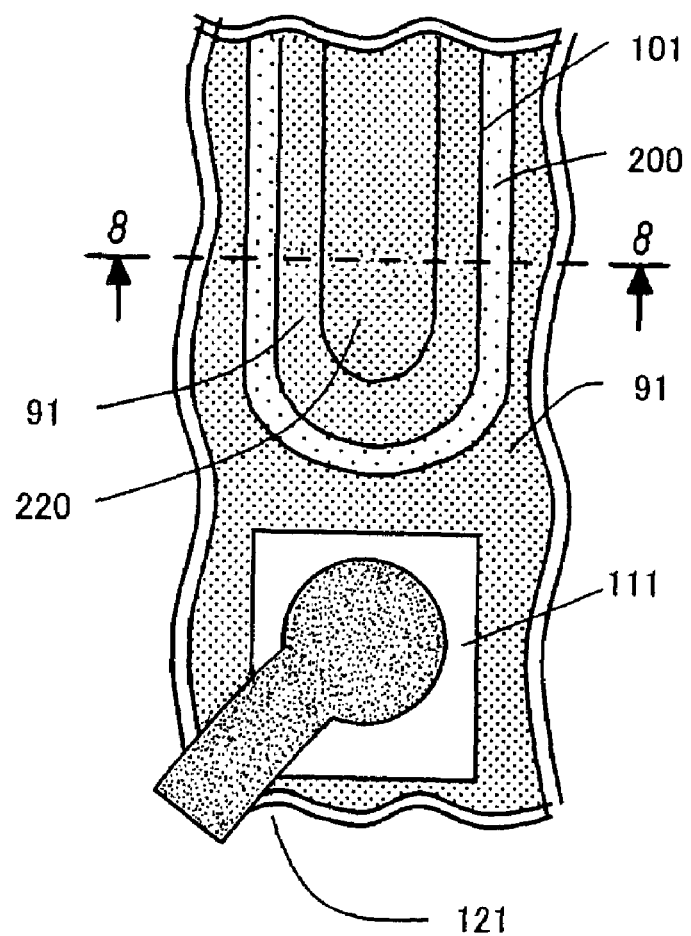
FIG. 7 is a plan view of a semiconductor device according to a second embodiment of the present invention.

FIG. 7 shows a semiconductor device according to a second embodiment of the present invention. The ion-through regions as the first openings of the semiconductor device shown in FIG. 7 have the same structure as that of the semiconductor device in the first embodiment. The semiconductor device according to the second embodiment is different from the semiconductor device according to the first embodiment in the following point. The semiconductor device in the first embodiment includes the lateral MOSFET, in which the source electrode 70 and the drain electrode 80 are located in the same plane. By contrast, the semiconductor device in the second embodiment includes a vertical MOSFET, in which the source electrode and the drain electrode are located in different planes.

Figure 8:
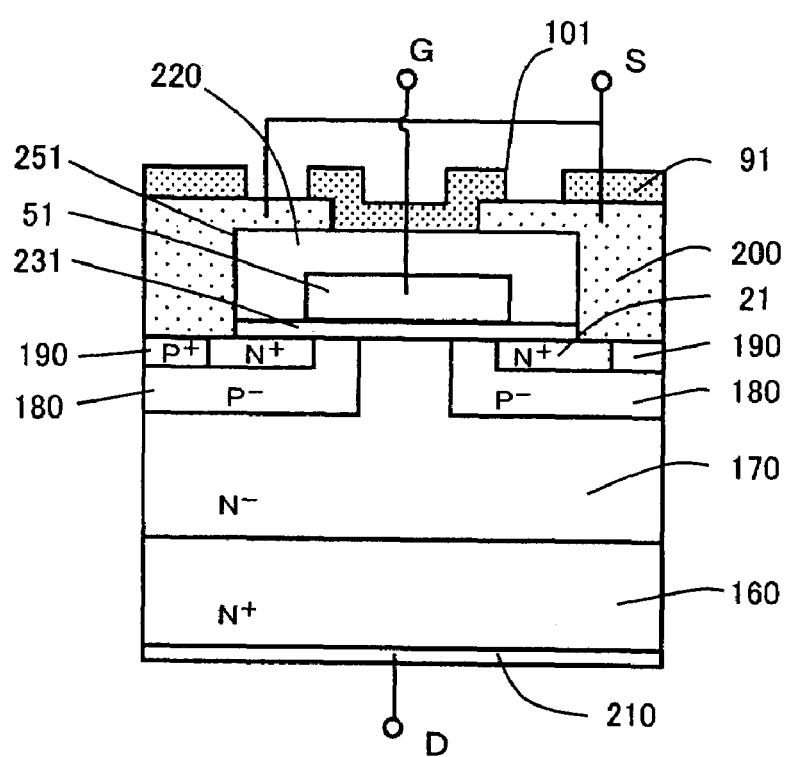
FIG. 8 is a cross-sectional view showing a structure of the semiconductor device according to the second embodiment.
Figure 9:
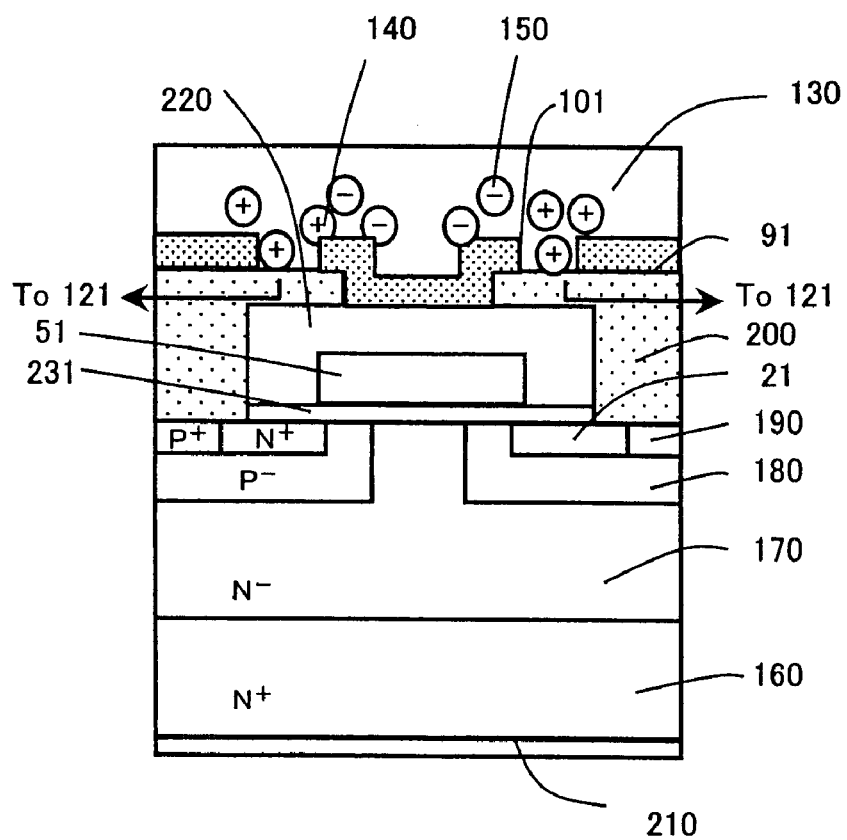
FIG. 9 is a cross-sectional view showing the semiconductor device according to the second embodiment in the state of being packaged with a sealing resin.

FIG. 7 is a plan view of one main part of the semiconductor device according to the second embodiment. FIG. 8 is a cross-sectional view of the semiconductor device taken along line B-B' in FIG. 7. FIG. 9 is a cross-sectional view showing the semiconductor device shown in FIG. 8 in the state of being packaged with a sealing resin. In FIG. 7, the vertical MOSFET includes a passivation film 91, an ion-through region 101, a source pad region 111, a bonding wire 121, a source electrode 200, and an inter-layer film 220.

The ion-through region 101 is a first opening formed in the passivation film 91. By forming the ion-through region 101, the source electrode 200 provided below the passivation film 91 is partially exposed. The source pad region 111 is a second opening formed in the passivation film 91. By forming the source pad region 111, the source electrode 200 provided below the passivation film 91 is partially exposed so as to be connectable to the bonding wire 121 extended from the outside of the semiconductor device. The ion-through region 101 and the source pad region 111 are located discretely from each other.

In FIG. 8, the semiconductor device including the vertical MOSFET includes an N$^+$-type source region 21, a gate electrode 51, the passivation film 91, the ion-through region 101, an N$^+$-type drain region 160, an N$^-$-type extended drain region 170, a P$^-$-type well region 180, a P$^+$-type contact region 190, the source electrode 200, a drain electrode 210, the inter-layer film 220, a gate insulating film 231, and a contact hole 251.

The N$^+$-type drain region 160 is formed in a main surface portion of the semiconductor substrate, and the N$^-$-type extended drain region 170 is formed on the N$^+$-type drain region 160. In the vertical MOSFET also, a drain region includes the N$^+$-type drain region 160 and the N$^-$-type extended drain region 170 having a lower impurity concentration than that of the N$^+$-type drain region 160. The drain electrode 210 is connected to the N$^+$-type drain region 160 having a higher impurity concentration. This realizes a high breakdown voltage semiconductor device which is usable in a condition where, for example, a high voltage of 600 V or higher is applied to the drain electrode 210.

On a main surface of the N$^-$-type extended drain region 170, the P$^-$-type well region 180 is formed. In the P$^-$-type well region 180, the N$^+$-type source region 21 and the P$^+$-type contact region 190 are formed. The gate insulating film 231 is formed on a main surface of the N$^-$-type extended drain region 170, and an end of the gate insulating film 231 is extended to overlap the N$^+$-type source region 21. The gate electrode 51 is formed on the gate insulating film 231. The inter-layer film 220 is an insulating film covering the gate insulating film 231 and the gate electrode 51. The contact hole 251 is formed through the inter-layer film 220. The source electrode 200 is connected to the N$^+$-type source region 21 and the P$^+$-type contact region 190 via the contact hole 251. The passivation film 91 covers a surface of the substrate body including the above-mentioned elements. The ion-through region 101 is formed in the passivation film 91 on the source electrode 200 as described above.

In FIG. 9, the sealing resin 130 covers the entire surface of the semiconductor substrate body. As one feature of this embodiment, the sealing resin 130 fills the ion-through region 101, and is in direct contact with the source electrode 200. This structure provides the semiconductor device with a high drain breakdown voltage. The reasons will be described in detail below.

In a vertical MOSFET having the above-described structure, when a high voltage is applied to the drain electrode 210 in an off state, a reverse voltage is applied to a junction between the N$^-$-type extended drain region 170 and the P$^-$-type well region 180, and a depletion layer expands in the N$^-$-type extended drain region 170. As a result, the N$^-$-type extended drain region 170 is completely depleted, and equipotential lines of the drain voltage are uniformly distributed in the N$^-$-type extended drain region 170.

When the semiconductor device in such a state is exposed to a high temperature and high humidity atmosphere, movable ions indicated as anions 140 and cations 150 in FIG. 9 are accumulated at an interface of the sealing resin 130 with the passivation film 91. In the semiconductor device according to this embodiment, the ion-through region 101 is formed in the passivation film 91 and the sealing resin 130 is in direct contact with the source electrode 200 via the ion-through region 101 as described above. Owing to such a structure, the movable ions (the anions 140 and the cations 150) accumulated at the interface of the sealing resin 130 with the passivation film 91 move, as indicated by the arrows in FIG. 9, to the source electrode 200 via the ion-through region 101. Finally, the movable ions are discharged to the bonding wire 121 extended from the outside the semiconductor device. Accordingly, the N$^-$-type extended drain region 170 is unlikely to be influenced by the movable ions. As a result, the reduction in the drain breakdown voltage can be suppressed.

The semiconductor device according to the present invention is generally used in the state where the potential of the source electrode 200 is zero and a high voltage is applied to the drain electrode 210. Under such conditions, it is considered that the anions 140 are mainly discharged through the ion-through region 101. However, either type of ions may pass through the ion-through region 101.

The vertical high breakdown voltage MOSFET having the above-described structure is produced, for example, as follows. In a main surface portion of the semiconductor substrate, the N$^+$-type drain region 160 is formed. On the N$^+$-type drain region 160, the N$^-$-type extended drain region 170 (impurity concentration: about 1E14 to about 1E16/cm$^3$) is formed. In a main surface portion of the N$^-$-type extended drain region 170, the P$^-$-type well region 180 is formed. In a main surface portion of the P$^-$-type well region 180, the N$^+$-type source region 21 (impurity concentration: about 1E18 to about 1E20/cm$^3$) and the P$^+$-type contact region 190 (impurity concentration: about 1E18 to about 1E20/cm$^3$) are formed. On a main surface of the N$^-$-type extended drain region 170, the gate insulating film 231 is formed and is extended at least to overlap the N$^+$-type source region 21.

On the gate insulating film 231, the gate electrode 51 is formed. The inter-layer film 220 is formed so as to cover the N$^-$-type extended drain region 170 and the N$^+$-type source region 21. Portions of the inter-layer film 220 on the N$^+$-type source region 21 and the P$^+$-type contact region 190 are opened to form the contact hole 251. The contact hole 251 is filled with the source electrode 200. The drain electrode 210 is formed so as to be connected to the N$^+$-type drain region 160. Then, the passivation film 91 is formed so as to cover the source electrode 200.

Next, the source pad region 111 and the ion-through region 101 are formed in the passivation film 91 discretely from each other. At this point, the ion-through region 101 is formed at a position which does not overlap the contact hole 251, preferably at a position far from the contact hole 251, with respect to a direction vertical to the drain regions 160 and 170. The reason is that at a position right above the contact hole 251 and in the vicinity thereof, various electrodes and films have a large thickness and thus form large steps.

Then, an upper surface of the passivation film 91 is coated with the sealing resin 130, and thus the semiconductor device is packaged. At this point, the ion-through region 101 is also filled with the sealing resin 130, such that the sealing resin 130 is in direct contact with the source electrode 200.

As described above, the semiconductor device according to this embodiment can also suppress the reduction in the drain breakdown voltage by a simple structure of providing openings in the passivation film 91. Accordingly, it is not necessary to adopt a two-layer structure for the electrodes as is required in the conventional semiconductor device, and thus the semiconductor device can be provided with a simple process and at low cost.

The planar pattern of the semiconductor device shown in FIG. 7 is merely exemplary, and the present invention is not limited to such a pattern. The structure of the semiconductor substrate and the regions formed therein are not limited to the above-described structure. The present invention is applicable to various types of structures.

Third Embodiment

Figure 10:
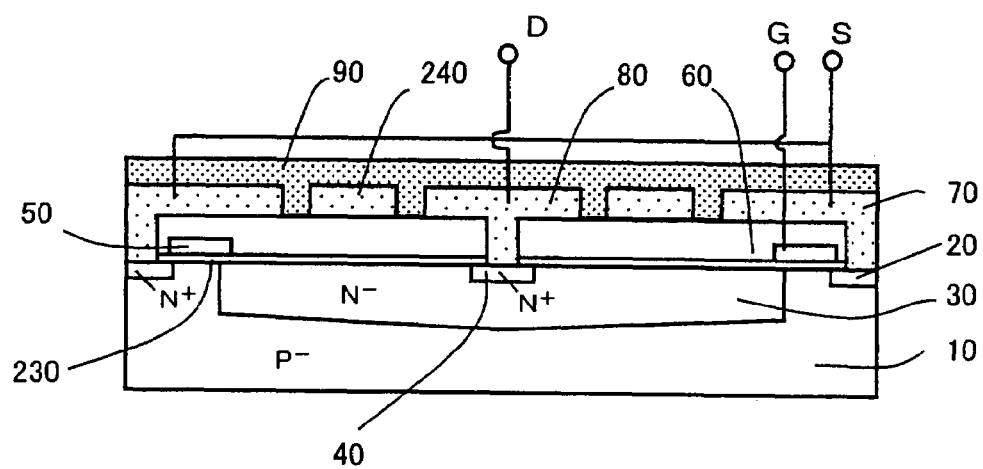
FIG. 10 is a cross-sectional view showing a structure of a semiconductor device according to a third embodiment of the present invention.

FIG. 10 shows a semiconductor device according to a third embodiment of the present invention. The semiconductor device according to the third embodiment is different from the semiconductor device according to the first embodiment in including a floating electrode 240 instead of the ion-through regions 100 and 102 in order to suppress the reduction in the drain breakdown voltage.

In the semiconductor device according to this embodiment, no ion-through region is formed in the passivation film 90. The floating electrode 240 is formed between the source electrode 70 and the drain electrode 80. The floating electrode 240, which is one feature of this embodiment, is an electrode having a floating potential and is not connected to any other electrode.

By providing the floating electrode 240, the following effect is provided. Even though the movable ions are accumulated at an interface of the sealing resin with the passivation film 90 in a high temperature and high humidity atmosphere, the charges of the movable ions are shielded by the floating electrode 240. Therefore, the equipotential distribution of the drain voltage is unlikely to be influenced by the movable ions. As a result, the reduction in the drain breakdown voltage in the high temperature and high humidity atmosphere can be suppressed.

In the case where the movable ions are shielded by the floating electrode 240, the equipotential lines of the drain voltage tend to be concentrated between the floating electrode 240 and the drain electrode 80. This can be solved and the reduction in the drain breakdown voltage is suppressed by providing a certain gap between the floating electrode 240 and the drain electrode 80.

The floating electrode 240 can be easily produced using a conventionally known technique merely by changing the shape of the mask pattern used for forming the source electrode 70 and the drain electrode 80. The semiconductor device according to this embodiment does not require the formation of the openings in the passivation 90 or 91 unlike the semiconductor devices in the first and second embodiments, and so can be produced by a simpler process and at lower cost.

Figure 11:
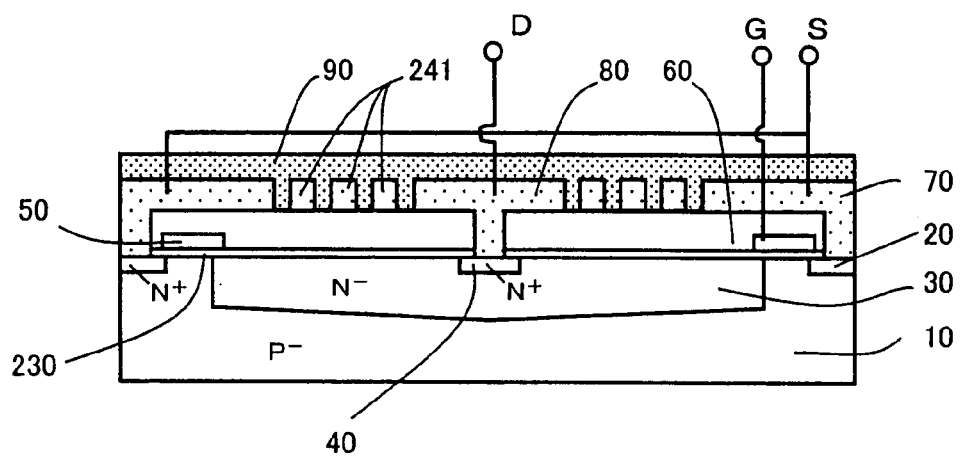
FIG. 11 is a cross-sectional view showing another structure of the semiconductor device according to the third embodiment.

In the above description, one floating electrode 240 is provided between the source electrode 70 and the drain electrode 80. The present invention is not limited to such a structure. A plurality of floating electrodes may be provided between the source electrode 70 and the drain electrode 80, and there is no specific limitation on the shape of the floating electrodes. For example, as shown in FIG. 11, a floating electrode 241 having a comb-like shape may be provided between the source electrode 70 and the drain electrode 80. This structure provides substantially the same effect as the structure described above.

Fourth Embodiment

Figure 12:
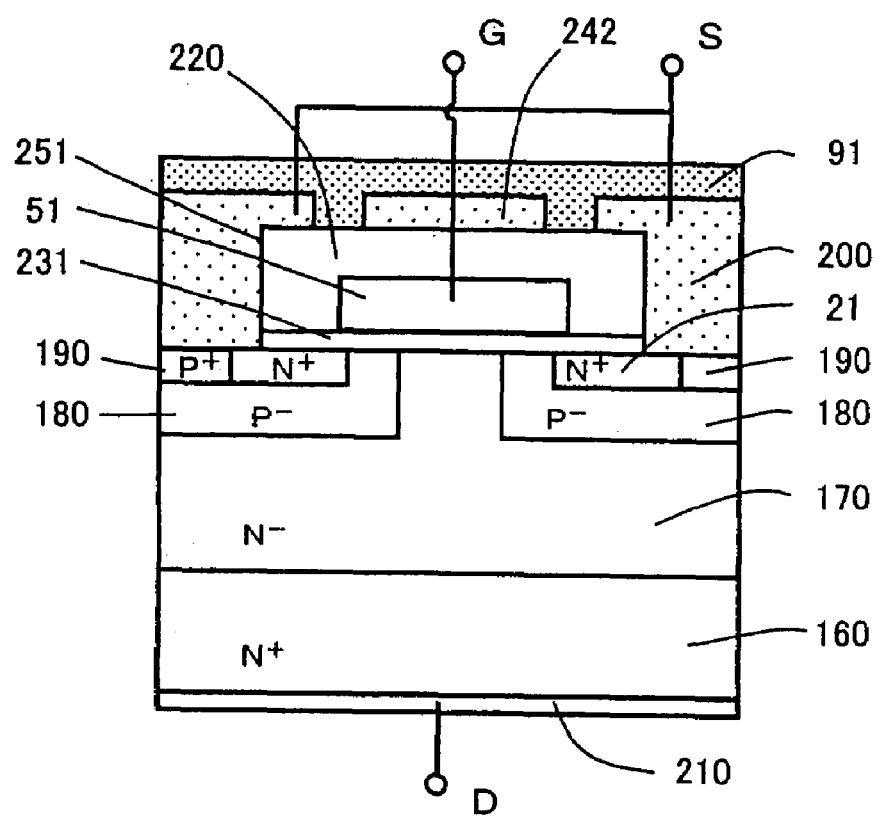
FIG. 12 is a cross-sectional view showing a structure of a semiconductor device according to a fourth embodiment of the present invention.
Figure 13:
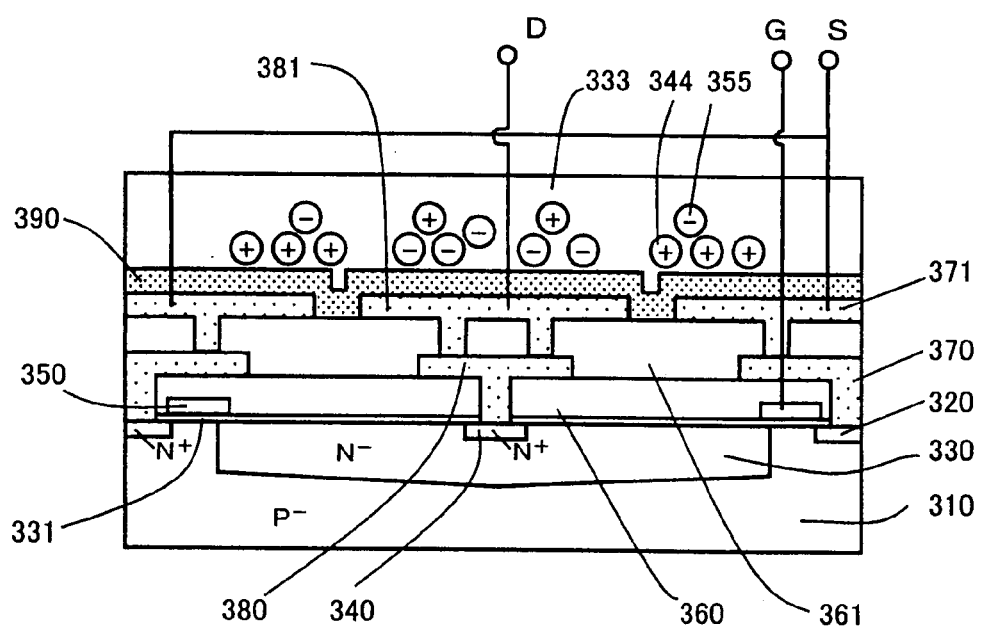
FIG. 13 is a cross-sectional view showing a structure of a conventional lateral high breakdown voltage power MOSFET.

FIG. 12 shows a semiconductor device according to a fourth embodiment of the present invention. The semiconductor device according to the fourth embodiment is different from the semiconductor device according to the second embodiment in including a floating electrode 242 instead of the ion-through region 101 in order to suppress the reduction in the drain breakdown voltage. The structure of the floating electrode 242 is the same as that of the floating electrode 240 described above in the third embodiment.

With the structure shown in FIG. 12, the following effect is provided. As described in the third embodiment, even though the movable ions are accumulated at an interface of the sealing resin with the passivation film 91 in a high temperature and high humidity atmosphere, the charges of the movable ions are shielded by the floating electrode 242. Therefore, the equipotential distribution of the drain voltage is unlikely to be influenced by the movable ions. As a result, the reduction in the drain breakdown voltage can be suppressed.

As described above, according to the present invention, even if movable ions are accumulated at an interface between the sealing resin used for packaging the semiconductor device and the passivation film, a simple structure of forming openings in the passivation film or providing a floating electrode between the electrodes can prevent the concentration of electric field in the drain region from being caused by the movable ions. Therefore, a semiconductor device having a high drain breakdown voltage even in a high temperature and high humidity atmosphere is provided. The semiconductor device according to the present invention operates stably in the high temperature and high humidity atmosphere and thus is useful as a power semiconductor device which needs to breakdown severe environments of use.

While the invention has been described in detail, the foregoing description is in all aspects illustrative and not restrictive. It is understood that numerous other modifications and variations can be devised without departing from the scope of the invention.

What is claimed is:

1. A semiconductor device in which a semiconductor substrate having a high breakdown voltage transistor formed thereon is covered with a sealing resin, the semiconductor device comprising:
   a source region and a drain region formed in a main surface portion of the semiconductor substrate;
   a gate insulating film formed on the drain region and having an end extended to overlap the source region;
   a gate electrode formed on the gate insulating film;
   a source electrode connected to the source region;
   a drain electrode connected to the drain region;
   an inter-layer film for covering the gate electrode and electrically insulating the gate electrode, the source electrode and the drain electrode from one another;
   a passivation film for covering an entire surface of a semiconductor substrate body;
   a first opening formed in the passivation film; and
   a sealing resin formed on the passivation film;
   wherein:
   the first opening is formed on at least either one of the source electrode and the drain electrode; and
   the sealing resin fills the first opening and is in direct contact with at least either one of the source electrode and the drain electrode.

2. A semiconductor device in which a semiconductor substrate having a high breakdown voltage transistor formed thereon is covered with a sealing resin, the semiconductor device comprising:
   a source region and a drain region formed in a main surface portion of the semiconductor substrate;
   a gate insulating film formed on the drain region and having an end extended to overlap the source region;
   a gate electrode formed on the gate insulating film;
   a source electrode connected to the source region;
   a drain electrode connected to the drain region;
   an inter-layer film for covering the gate electrode and electrically insulating the gate electrode, the source electrode and the drain electrode from one another;
   a passivation film for covering an entire surface of a semiconductor substrate body;
   a first opening formed in the passivation film;
   a sealing resin formed on the passivation film; and an assisting electrode provided below the passivation film and electrically connected to the source electrode or the drain electrode;

wherein:

the assisting electrode is formed of a conductive material which is different from a material forming the source electrode or the drain electrode connected to the assisting electrode;

the first opening is formed on the assisting electrode; and the sealing resin fills the first opening and is in direct contact with the assisting electrode.

3. A semiconductor device according to claim 1, wherein:

the passivation film has a second opening formed therethrough for connecting a metal wire extended from the outside of the semiconductor device to at least one type of electrode selected from the source electrode and the drain electrode; and the first opening and the second opening are discrete from each other.

4. A semiconductor device according to claim 1 or 2, wherein:

the inter-layer film has a contact hole formed therethrough on a part of the source region or the drain region;

the source electrode or the drain electrode fill the contact hole so as to be respectively connected to the source region or the drain region which is below the contact hole; and the first opening and the contact hole are located at positions which do not overlap each other in a direction perpendicular to the surface of the semiconductor substrate.

5. A semiconductor device according to claim 1 or 2, wherein:

the drain region includes a high concentration drain region having a relatively high impurity concentration and an extended drain region having an impurity concentration lower than the impurity concentration of the high concentration drain region; and the drain electrode is connected to the high concentration drain region.

6. A semiconductor device according to claim 2, wherein:

the passivation film has a second opening formed therethrough for connecting a metal wire extended from the outside of the semiconductor device to the assisting electrode; and the first opening and the second opening are discrete from each other.

* * * * *